(12) United States Patent
Chen et al.

(10) Patent No.: US 8,719,686 B2
(45) Date of Patent: May 6, 2014

(54) PROBABILITY-BASED MULTI-LEVEL LDPC DECODER

(75) Inventors: Lei Chen, Santa Clara, CA (US); Johnson Yen, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 153 days.

(21) Appl. No.: 13/302,119

(22) Filed: Nov. 22, 2011

(65) Prior Publication Data
US 2013/0132790 A1 May 23, 2013

(51) Int. Cl.
*G06F 11/00* (2006.01)
*H03M 13/00* (2006.01)

(52) U.S. Cl.
USPC ............................................. 714/810

(58) Field of Classification Search
USPC .......... 714/758, 804, 746, 800–801, 807, 810
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Shelly A Chase
(74) *Attorney, Agent, or Firm* — Hamilton DeSanctis & Cha (57) ABSTRACT

Various embodiments of the present invention are related to methods and apparatuses for decoding data, and more particularly to methods and apparatuses for probability-based multi-level LDPC decoding. For example, in one embodiment an apparatus includes a horizontal updater in a low density parity check decoder operable to iteratively perform row processing to update probabilities of multi-level symbol values, a vertical updater in the low density parity check decoder operable to iteratively perform column processing to update the probabilities of the multi-level symbol values, and a check sum calculation circuit operable to calculate total soft values for the multi-level symbol values.

20 Claims, 4 Drawing Sheets

(56) References Cited

U.S. PATENT DOCUMENTS

| | | | |
|---|---|---|---|
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson et al. | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song et al. | |
| 7,073,118 B2 | 7/2006 | Greenberg et al. | |
| 7,093,179 B2 | 8/2006 | Shea | |
| 7,117,427 B2 | 10/2006 | Ophir et al. | |
| 7,133,228 B2 | 11/2006 | Fung et al. | |
| 7,184,486 B1 | 2/2007 | Wu | |
| 7,191,378 B2 | 3/2007 | Eroz et al. | |
| 7,197,690 B2 * | 3/2007 | Shen et al. | 714/792 |
| 7,203,887 B2 | 4/2007 | Eroz et al. | |
| 7,308,061 B1 | 12/2007 | Huang | |
| 7,310,768 B2 | 12/2007 | Eidson et al. | |
| 7,313,750 B1 | 12/2007 | Feng | |
| 7,370,258 B2 | 5/2008 | Iancu et al. | |
| 7,415,651 B2 | 8/2008 | Argon | |
| 7,502,189 B2 | 3/2009 | Sawaguchi et al. | |
| 7,523,375 B2 | 4/2009 | Spencer | |
| 7,587,657 B2 | 9/2009 | Haratsch | |
| 7,590,168 B2 | 9/2009 | Raghavan et al. | |
| 7,646,829 B2 | 1/2010 | Ashley et al. | |
| 7,676,734 B2 * | 3/2010 | Yamagishi | 714/780 |
| 7,702,986 B2 | 4/2010 | Bjerke et al. | |
| 7,752,523 B1 * | 7/2010 | Chaichanavong et al. | 714/755 |
| 7,779,325 B2 | 8/2010 | Song | |
| 7,802,172 B2 | 9/2010 | Vila Casado et al. | |
| 7,805,654 B2 * | 9/2010 | Seki | 714/755 |
| 7,849,388 B2 * | 12/2010 | Esumi et al. | 714/800 |
| 7,952,824 B2 | 5/2011 | Dziak et al. | |
| 7,958,425 B2 | 6/2011 | Chugg et al. | |
| 7,996,746 B2 | 8/2011 | Livshitz et al. | |
| 7,996,752 B2 * | 8/2011 | Prabhakar et al. | 714/800 |
| 8,018,360 B2 | 9/2011 | Nayak | |
| 8,069,397 B2 * | 11/2011 | Vityaev et al. | 714/774 |
| 8,201,051 B2 | 6/2012 | Tan et al. | |
| 8,237,597 B2 | 8/2012 | Liu et al. | |
| 8,261,171 B2 | 9/2012 | Annampedu | |
| 8,291,284 B2 | 10/2012 | Savin | |
| 8,295,001 B2 | 10/2012 | Liu et al. | |
| 2004/0109507 A1 * | 6/2004 | Kanter et al. | 375/259 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions On Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^m$) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/295,150, Unpublished (filed Nov. 14, 2011) (Zongwang Li).

U.S. Appl. No. 13/113,219, Unpublished (filed May 23, 2011) (Yang Han).

U.S. Appl. No. 13/227,544, Unpublished (filed Sep. 8, 2011) (Shaohua Yang).

U.S. Appl. No. 13/283,549, Unpublished (filed Oct. 27, 2011) (Wu Chang).

U.S. Appl. No. 13/284,767, Unpublished (filed Oct. 28, 2011) (Fan Zhang).

U.S. Appl. No. 13/174,453, Unpublished (filed Jun. 30, 2011) (Johnson Yen).

U.S. Appl. No. 13/174,537, Unpublished (filed Jun. 30, 2011) (Anantha Raman Krishnan).

U.S. Appl. No. 13/296,022, Unpublished (filed Nov. 14, 2011) (Victor Krachkovsky).

U.S. Appl. No. 13/227,416, Unpublished (filed Sep. 7, 2011) (Lei Chen).

U.S. Appl. No. 13/180,495, Unpublished (filed Jul. 11, 2011) (Chung-Li Wang).

(56) References Cited

OTHER PUBLICATIONS

U.S. Appl. No. 13/300,078, Unpublished (filed Nov. 18, 2011) (Chung-Li Wang).
U.S. Appl. No. 13/213,751, Unpublished (filed Aug. 19, 2011) (Fan Zhang).
U.S. Appl. No. 13/186,234, Unpublished (filed Jul. 19, 2011) (Haitao Xia).
U.S. Appl. No. 13/269,852, Unpublished (filed Oct. 10, 2011) (Haitao Xia).
U.S. Appl. No. 13/269,832, Unpublished (filed Oct. 10, 2011) (Haitao Xia).
U.S. Appl. No. 13/284,730, Unpublished (filed Oct. 28, 2011) (Fan Zhang).
U.S. Appl. No. 13/171,615, Unpublished (filed Jun. 29, 2011) (Bradley D. Seago).
U.S. Appl. No. 13/239,683, Unpublished (filed Sep. 22, 2011) (Changyou Xu).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Joint Code-Encoder Design for LDPC Coding System VLSI Implementation", ISCAS, IEEE pp. 389-392, May 2004.
Zhong et al., "Design of VLSI Implementation-Oriented LDPC Codes", IEEE, pp. 670-673, 2003.
Zhong, "Block-LDPC: A Practical LDPC Coding System Design Approach", IEEE Trans. On Circuits, Regular Papers, vol. 5, No. 4, pp. 766-775, Apr. 2005.

* cited by examiner

PROBABILITY-BASED MULTI-LEVEL LDPC DECODER

BACKGROUND

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

Figure 1:
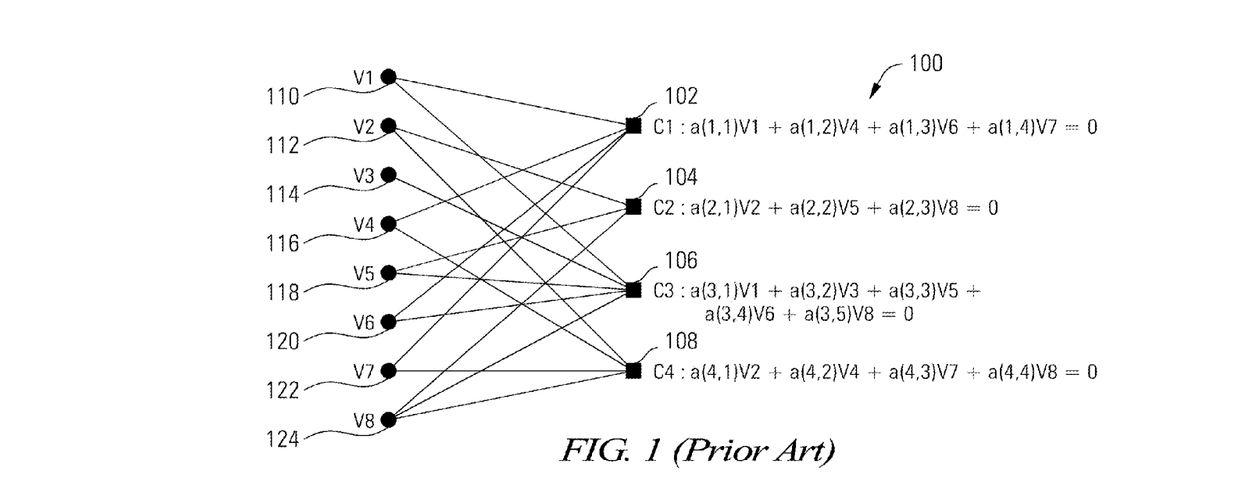
FIG. 1 depicts a Tanner graph of an example prior art LDPC code.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element $a(i,j)$ from the Galois field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes.

Decoding of binary LDPC codes is typically simplified by making approximations in calculations. However, although non-binary or multi-level LDPC decoders can provide much better error detection and correction performance than binary LDPC decoders, the approximations and simplifications applied in binary LDPC decoders are generally not applicable to multi-level LDPC decoders. A need thus remains for efficient multi-level LDPC decoders.

BRIEF SUMMARY

Various embodiments of the present invention are related to methods and apparatuses for decoding data, and more particularly to methods and apparatuses for probability-based multi-level LDPC decoding. For example, in one embodiment an apparatus includes a horizontal updater in a low density parity check decoder operable to iteratively perform row processing to update probabilities of multi-level symbol values, a vertical updater in the low density parity check decoder operable to iteratively perform column processing to update the probabilities of the multi-level symbol values, and a check sum calculation circuit operable to calculate total soft values for the multi-level symbol values. In some embodiments, $q_{ml}^{(a)}$ and $r_{ml}^{(a)}$ are iteratively updated in the vertical and horizontal updaters, respectively. $q_{ml}^{(a)}$ represents the probability that the l'th element of $\underline{x}$ is a, where $\underline{x}$ is the transmitted codeword and a is an element of a Galois field, given the extrinsic information obtained from all the check nodes other than m. $r_{ml(a)}$ approximates the probability that the m'th check is satisfied if element l of $\underline{x}$ is a and the other variable symbols have a separable distribution given by $q_{ml'}^{(a)}$.

In some embodiments, the horizontal updater includes a multiplier and an adder, the vertical updater includes a multiplier, and the check sum calculation circuit includes a multiplier. In some embodiments, the horizontal updater iteratively calculates probabilities for symbols in previous columns and iteratively calculates probabilities for symbols in following columns. In some embodiments, the check sum calculation circuit determines whether a stopping criterion has been met and calculates a hard decision for each symbol as an element in a Galois field having a highest probability for each of the symbols.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

Various embodiments of the present invention are related to methods and apparatuses for decoding data, and more particularly to methods and apparatuses for decoding data in a probability-based multi-level LDPC decoder. The LDPC decoder is a GF(q) symbol-based decoder, where GF(q) is a Galois field with q elements, where q is a power of a prime.

Figure 2:
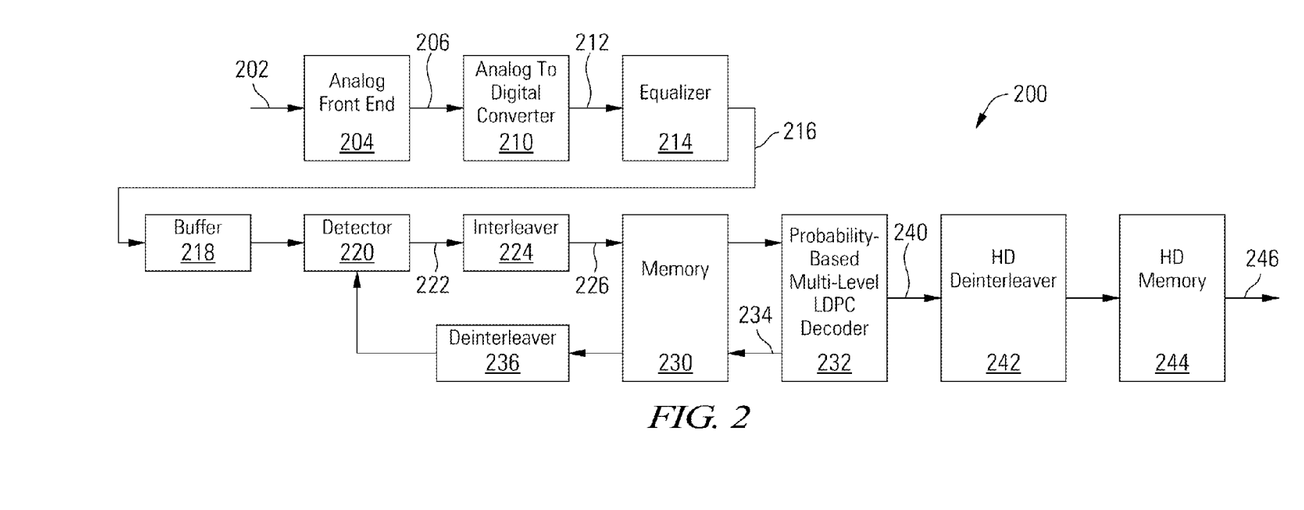
FIG. 2 depicts a block diagram of a read channel with a probability-based multi-level LDPC decoder which may be used to retrieve or receive stored or transmitted data in accordance with various embodiments of the present invention.

Although the LDPC decoder disclosed herein is not limited to any particular application, several examples of applications are presented herein that benefit from embodiments of the present invention. Turning to FIG. 2, a read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In these embodiments, the detected output 222 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is provided to an interleaver 224 that protects data against burst errors. Burst errors overwrite localized groups or bunches of bits. Because LDPC decoders are best suited to correcting errors that are more uniformly distributed, burst errors can overwhelm LDPC decoders. The interleaver 224 prevents this by interleaving or shuffling the detected output 222 from data detector 220 to yield an interleaved output 226 which is stored in a memory 230. The interleaved output 226 from the memory 230 is provided to a probability-based multi-level LDPC decoder 232 which performs parity checks on the interleaved output 226, ensuring that parity constraints established by an LDPC encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the LDPC decoder 232.) To perform a global iteration, LLR values 234 from the LDPC decoder 232 are stored in memory 230, deinterleaved in a deinterleaver 236 to reverse the process applied by interleaver 224, and provided again to the data detector 220 to allow the data detector 220 to repeat the data detection process, aided by the LLR values 234 from the LDPC decoder 232. In this manner, the read channel 200 can perform multiple global iterations, allowing the data detector 220 and LDPC decoder 232 to converge on the correct data values.

The LDPC decoder 232 also produces hard decisions 240 about the values of the symbols contained in the interleaved output 226 of the interleaver 224. For a GF(4) LDPC decoder, the hard decisions may be represented by four field elements 00, 01, 10, and 11.

The hard decisions 240 from LDPC decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

In some embodiments, the probability-based multi-level LDPC decoder performs iterative decoding based on belief propagation (IDBP) or sum-product algorithm (SPA) which gives excellent error performance and is practically implementable. The probability-based multi-level LDPC decoder may better be understood by illustrating the differences in some embodiments of the multi-level decoder with respect to a probability-based binary LDPC decoder. In such a probability-based binary LDPC decoder, a codeword $c=(c_1\ c_2\ \ldots\ c_N)$ is mapped to a bipolar sequence $x=(x_1 x_2 \ldots \bar{x}_N)$ to transmit, where $x_l = 2c_l - 1$. Let $\underline{y} = (y_1 y_2 \ldots y_N)$ be the received sequence. Let $$p_l^0 = p(y_l \mid c_l = 0) = \frac{1}{\sqrt{\pi N_0}} e^{-(y_l - 1)^2 / N_0} \quad \text{(Eq 1)}$$

$$p_l^1 = p(y_l \mid c_l = 1) = \frac{1}{\sqrt{\pi N_0}} e^{-(y_l + 1)^2 / N_0} \quad \text{(Eq 2)}$$

where equations 1 and 2 calculate the probability that the bit in the l'th position has the value 0 and 1, respectively. $p(y_l|c_l=0)$ is the probability distribution of $y_l$ when codeword bit c in l'th position is 0 for jointly distributed variables $y_l$ and $c_l$. $N_0/2$ is the white noise variance.

$$f_l^0 = \frac{p_l^0}{p_l^0 + p_l^1} \quad \text{(Eq 3)}$$

$$f_l^1 = \frac{p_l^1}{p_l^0 + p_l^1} \quad \text{(Eq 4)}$$

where $f_l^0$ and are relative versions of the probabilities calculated in equations 1 and 2, normalized so that the probabilities for each of the two possible values 0 and 1 combined equal 100 percent.

Let $q_{ml}^x$ be the conditional probability that the transmitted code bit $c_l$ has value x, given the check-sums computed based on the check vectors other than m. Let $r_{ml}^x$ be the conditional probability that the check sum is satisfied, given $c_l = x$ (0 or 1) and the other code bits have a separable distribution. The decoding algorithm is as follows:

1. Initialization:

$$q_{ml}^0 = f_l^0 = \frac{p_l^0}{p_l^0 + p_l^1} \quad \text{(Eq 5)}$$

$$q_{ml}^1 = f_l^1 = \frac{p_l^1}{p_l^0 + p_l^1} \quad \text{(Eq 6)}$$

2. Iterative Processing:
a. Horizontal Step:

$$r_{ml}^0 = \frac{1}{2}\left(1 + \prod_{l' \in N(m)\setminus l} (q_{ml'}^0 - q_{ml'}^1)\right) \quad \text{(Eq 7)}$$

$$r_{ml}^1 = \frac{1}{2}\left(1 - \prod_{l' \in N(m)\setminus l} (q_{ml'}^0 - q_{ml'}^1)\right) \quad \text{(Eq 8)}$$

where in is the row number, l is the column number, N(m) is the set of all non-zero columns in row m, and where l' includes the values of every non-zero column in row m except from the current column being processed. The $\Pi$ operation thus multiplies the differences between the conditional probabilities for a 0 and 1 value for each extrinsic input in the row. The horizontal step calculates r probability values row by row, based on the theory that the checksum for a row must be equal to zero.

b. Vertical Step:

$$q_{ml}^0 = \alpha_{ml} f_l^0 \prod_{m' \in M(l)\setminus m} r_{m'l}^0 \quad \text{(Eq 9)}$$

$$q_{ml}^1 = \alpha_{ml} f_l^1 \prod_{m' \in M(l)\setminus m} r_{m'l}^1 \quad \text{(Eq 10)}$$

where $\alpha_{ml}$ is a normalization factor such that $q_{ml}^0 + q_{ml}^1 = 1$, M(l) is the set of all non-zero rows in column l, and where m' includes the values of every non-zero row in column l except from the current row being processed. $q_{ml}^0$ is the soft value or the probability that the bit in row m and column l is 0, and $q_{ml}^1$ is the probability that the bit is 1.

$$q_l^0 = \alpha_l f_l^0 \prod_{m' \in M(l)} r_{m'l}^0 \quad \text{(Eq 11)}$$

$$q_l^1 = \alpha_l f_l^1 \prod_{m' \in M(l)} r_{m'l}^1 \quad \text{(Eq 12)}$$

where $\alpha_l$ is a normalization factor such that $q_l^0 + q_l^1 = 1$. $q_l$ is the total probability for column l, based on the multiplied probabilities of the non-zero values from every row.

c. Hard Decision and Stopping Criterion Test:

$$\hat{c}_l = 0 \text{ if } q_l^0 > q_l^1 \quad \text{(Eq 13)}$$

$$\hat{c}_l = 1 \text{ otherwise} \quad \text{(Eq 14)}$$

If $H \cdot \hat{c} = 0$ over GF(2), where $\hat{x} \in GF(2)^N$, the decoding process is finished with $\hat{c}$ as the decoder output; otherwise, repeat step 2 until the maximum iteration number.

Again, the probability-based multi-level LDPC decoder operates on symbols from GF(q) rather than binary bits, where GF(q) is a Galois field with q elements, and where q is a power of a prime. For example, in a GF(4) decoder, a 2-bit symbol a may take the value 00, 01, 10 or 11. If a is 2 or 10 in binary, and if the probability of the first bit is $p_{l_1}$ and the probability of the second bit is $p_{l_2}$, the probability of the symbol is the product $p_{l_1} \cdot p_{l_2}$. A multi-level LDPC code of length n is given by the null space over GF(q) of a sparse parity-check matrix H over GF(q). Let edge $e_{ml}$ connect check node m with bit node symbol l. For each edge $e_{ml}$ in the Tanner graph, $q_{ml}^{(a)}$ and $r_{ml}^{(a)}$ are iteratively updated. $q_{ml}^{(a)}$ represents the probability that the l'th element of x is α, given the extrinsic information obtained from all the check nodes other than m. $r_{ml}^{(a)}$ approximates the probability that the m'th check is satisfied if element l of x is a and the other variable symbols have a separable distribution given by $q_{ml'}^{(a)}$.

1. Initialization:

$$P_l^{(a)} = p_{l_1}^{(a_1)} \cdot p_{l_2}^{(a_2)} \cdots p_{l_s}^{(a_s)} \quad \text{(Eq 15)}$$

$$q_{ml}^{(a)} = p_l^{(a)} \quad \text{(Eq 16)}$$

where $a \in GF(q)$, $l \in N$, the set of all columns in the current row, $(a_1 \, a_2 \ldots a_s)$ is the binary vector representation of a, and $(l_1 \, l_2 \ldots l_s)$ is the binary vector representation of l.

2. Iterative Processing:

a. Horizontal Step:

Let $$\sigma_{mk} = \sum_{j:j \leq k} H_{mj} x_j' \quad \text{(Eq 17)}$$

where $H_{mj}$ includes the non-zero elements from the H matrix for previous columns, and where $x_j'$ includes the transmitted values for the previous columns. $\sigma_{mk}$ is the sum of all the multiplied transmitted values and corresponding H matrix elements for previous columns.

$$\rho_{mk} = \sum_{j:j \geq k} H_{mj} x_j' \quad \text{(Eq 18)}$$

where $H_{mj}$ includes the non-zero elements from the H matrix for subsequent or following columns, and where $x_j'$ includes the transmitted values for the subsequent columns. $\rho_{mk}$ is the sum of all the multiplied transmitted values and corresponding H matrix elements for following columns. Thus a checknode calculation or parity check calculation for a given row m includes all the variable nodes with non-zero H matrix elements in the row.

i. If i, j are successive indexes with j>i in N(m), the set of all non-zero columns in row m, then $$P[\sigma_{mj} = a] = \sum_{\{s,t:H_{mj} \cdot t + s = a\}} P[\sigma_{mi} = s] q_{mj}^t \quad \text{(Eq 19)}$$

where $P[\sigma_{mi} = s]$ is the probability that each σ value in the current row and over all previous columns has the value s.

$$P[\sigma_{m0} = a] = \sum_{\{t,H_{m0} \cdot t = a\}} q_{m0}^t \quad \text{(Eq 20)}$$

where Equation 20 is the special case for the first column 0. Calculate $P[\sigma_{mk} = a]$ for each $k \in N(m)$ and each $a \in GF(q)$. Whereas in the binary decoder disclosed above, the probabilities were calculated that a bit had the values 0 and 1, in the multi-level LDPC decoder, the probabilities are calculated that a symbol has the value a of each element in the Galois field GF(q).

ii. If i, j are successive indexes in N(m) with j<i, then $$P[\rho_{mj} = a] = \sum_{\{s,t:H_{mj} \cdot t + s = a\}} P[\rho_{mi} = s] q_{mj}^t \quad \text{(Eq 21)}$$

where $P[\rho_{mi} = s]$ is the probability that each ρ value in the current row and over all later or following columns has the value s.

$$P[\rho_{m,n-1} = a] = \sum_{\{t:H_{m,n-1} \cdot t = a\}} q_{m,n-1}^t \quad \text{(Eq 22)}$$

Calculate $P[\rho_{mk} = a]$ for each $k \in N(m)$ and each $a \in GF(q)$.

iii.

$$r_{ml}^{(a)} = P[(\sigma_{m(l-1)} + \rho_{m(l+1)}) + H_{ml} \cdot a = 0] \quad \text{(Eq 23)}$$

$$= \sum_{\{s,t:s+t+H_{ml} \cdot a = 0\}} P[\sigma_{m(l-1)} = s] \cdot P[\rho_{m(l+1)} = t]$$

where $r_{ml}^{(a)}$ is the probability that the transmitted codeword symbol at row m and column l of the H matrix has value a, where a is the set of elements in the Galois field, where $P[\sigma_{m(l-1)} = s]$ is the probability that σ in row m in the previous column l−1 has value s, as calculated in step i above, and where $P[\rho_{m(l+1)} = t]$ is the probability that ρ in row m in the next column l+1 has value t, as calculated in step i above. The checksum generated by adding the probabilities from the three columns, σ from the previous column, ρ from the next column, and $H_{ml} \cdot a$ from the current column, should equal zero. The second form of Equation 23 is arrived at based on the probability theory that if the probability of probability of a+b=0, this is equivalent to the summation of the probabilities [a=s]·[b=t] with the s+t+$H_{ml}$·a=0 condition satisfied. Similarly, in Equation 19, the probability that $\sigma_{mj}$=a is equal to the summation of the probabilities that $\sigma_{mi}$=s times the probability that q at row m and column j is equal to t, with the condition that $H_{mj}$·t+s=a.

$$r_{m0}^{(a)} = P[\rho_{m_1} + H_{m0} \cdot a = 0] \quad \text{(Eq 24)}$$

$$= \sum_{\{t:t+H_{m0} \cdot a = 0\}} P[\rho_{m_1} = t]$$

where Equation 24 is the special case, for the first column 0.

$$r_{m,n-1}^{(a)} = P[\sigma_{m,n-1} + H_{m,n-1} \cdot a = 0] \quad \text{(Eq 25)}$$

$$= \sum_{\{s:s+H_{m,n-1} \cdot a = 0\}} P[\sigma_{m,n-1} = s]$$

where Equation 25 is the special case, for the last column n−1. Again, $r_{ml}^{(a)}$ approximates the probability that the m'th check is satisfied if element l of x is a and the other variable symbols have a separable distribution given by $q_{ml'}^{(a)}$. In other words, the horizontal updater is operable to approximate a probability that a checksum on a given row of the H matrix is satisfied if an element of a transmitted value has a particular value selected from a Galois field.

b. Vertical Step:

$$q_{ml}^{(a)} = \alpha_{ml} P_l^{(a)} \cdot \prod_{m' \in M(l) \backslash m} r_{m'l}^{(a)} \quad \text{(Eq 26)}$$

for each $a \in GF(q)$, where $\alpha_{ml}$ is chosen such that $\Sigma_{a=0}^{q-2} q_{ml}^{(a)} = 1$. The normalization factor $\alpha_{ml}$ ensures that the sum of the probabilities of the soft values q equals 1, given that there are q−1 total soft values in the normalized format of the vertical step, indexed from 0 to q−2. Equation 26 calculates the product of probabilities for column l over all rows m' except the current row m. Again, $q_{ml}^{(a)}$ represents the probability that the l'th element of x is a, given the extrinsic information obtained from all the check nodes other than m. In other words, the vertical update calculates the probability that an element of a transmitted value on a given column of an H matrix has a particular value selected from a Galois field based on extrinsic information from all the check nodes in the row other than those in the same row as the transmitted value being updated.

c. Hard Decision and Stopping Criterion Test:

$$q_l^{(a)} = \alpha_l P_l^{(a)} \cdot \prod_{m' \in M(l)} r_{m'l} \quad \text{(Eq 27)}$$

where $\hat{x}_l = a$ if $q_l^{(a)}$ is the largest. If $H \cdot \hat{x} = 0$ over $GF(q)$, where $\hat{x} \in GF(q)^N$, the decoding process is finished with $\hat{x}$ as the decoder output; otherwise, repeat step 2 until the maximum iteration number. Notably, Equation 27 does not exclude the current row as in Equation 26, because for the hard decision all rows are included to obtain the total soft value.

Figure 3:
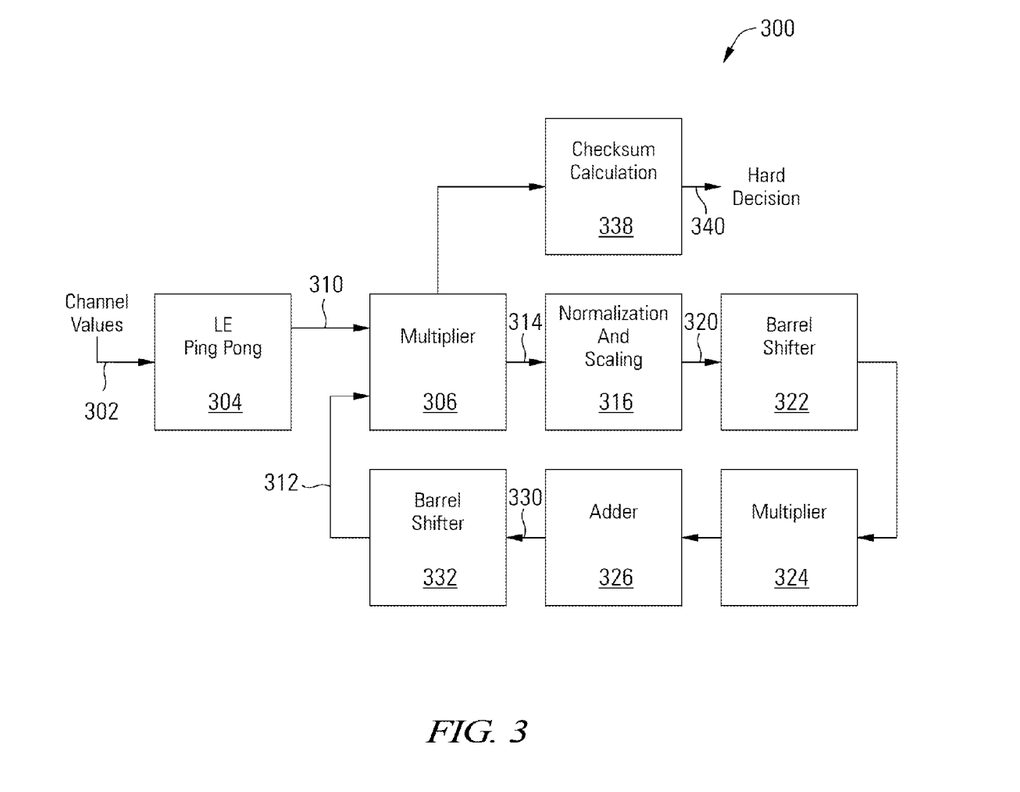
FIG. 3 depicts a block diagram of a probability-based multi-level LDPC decoder in accordance with various embodiments of the present invention.

Turning to FIG. 3, a probability-based multi-level LDPC decoder 300 is depicted which may be used to implement the probability-based multi-level decoding disclosed above in accordance with some embodiments of the invention. LLR channel values are received by the LDPC decoder 300 on input 302 and stored in a memory 304 as P values to initialize the probabilities according to Equation 15. The vertical update process disclosed above in Equation 26 is partially performed in a multiplier 306 to yield pre-normalized $q_{ml}^{(a)}$ Q values 314. Multiplier 306 initially receives P values 310 from memory 304 and generates the initial Q values 314 based on P values 310 according to Equation 16. Thereafter, multiplier 306 generates pre-normalized Q values 314 based on R values 312 according to Equation 26. The normalization portion of Equation 26 is performed in a normalizer 316, which yields $q_{ml}^{(a)}$ Q values 320. The Q values 320 are shifted in a barrel shifter 322 to move between columns and rows in the H matrix.

The horizontal update process disclosed above in Equations 19-25 is performed in a multiplier 324 and adder 326, which iteratively calculate $r_{ml}^{(a)}$ R values 330, the probability that the transmitted codeword symbols at each row m and column l of the H matrix have value a, for each element a in the Galois field. The R values 330 are shifted in a barrel shifter 332 to move between columns and rows in the H matrix.

A checksum calculation circuit 338 calculates checksums to determine whether the LDPC decoder 300 has met a stopping criterion, determining whether $H \cdot \hat{x} = 0$ over $GF(q)$, where $\hat{x} \in GF(q)^N$. If so, the decoding process is finished with $\hat{x}$ hard decisions 340 as the decoder output, where $\hat{x}_l = a$ for total soft value $q_l^{(a)}$ having the largest probability value as calculated in Equation 27. In some embodiments, the checksum calculation circuit 338 also operates as a hard decision calculator.

Figure 4:
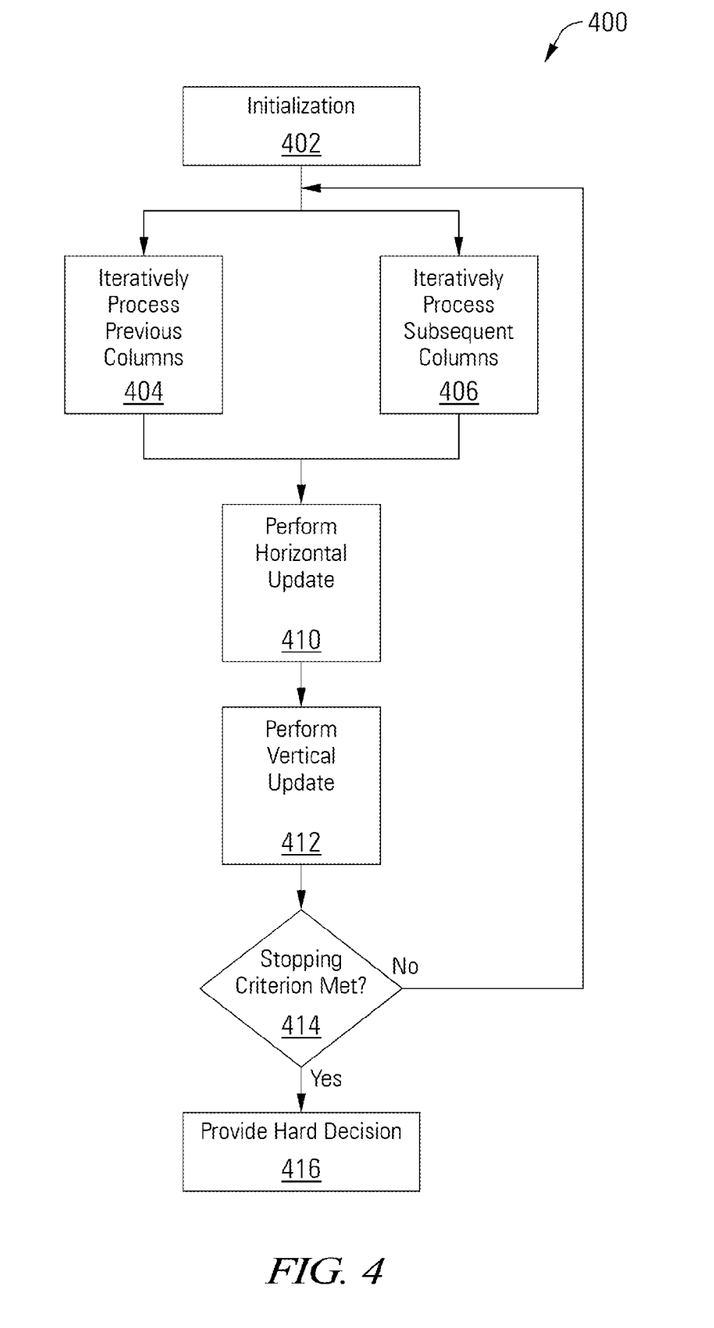
FIG. 4 depicts a flow diagram showing a method for probability-based multi-level LDPC decoding in accordance with various embodiments of the present invention.

Turning to FIG. 4, a flow diagram 400 depicts a method for probability-based multi-level LDPC decoding in accordance with various embodiments of the present invention. The method of FIG. 4, or variations thereof, may be performed in data decoding circuits such as those illustrated in FIG. 3. Following flow diagram 400, the decoding operation is initialized. (Block 402) In some embodiments, this is performed according to Equations 15 and 16. Previous columns are iteratively processed (block 404), and subsequent columns are iteratively processed (block 406), in some embodiments according to Equations 19-20 and 21-22, respectively. The horizontal update is performed (block 410), in some embodiments according to Equations 23-25. In some embodiments, the iterative processing of previous columns and subsequent columns is considered to be part of the horizontal update. The vertical update is performed (block 412), in some embodiments according to Equation 26. A determination is made as to whether a stopping criterion has been met. (Block 414) In some embodiments, this comprises determining whether $H \cdot \hat{x} = 0$ over $GF(q)$, where $\hat{x} \in GF(q)^N$. If not, decoding continues with blocks 404 and 406 until a stopping criterion is met or until the maximum number of local iterations has been reached. When the stopping criterion has been met, the hard decision is provided. (Block 416) In some embodiments, the hard decision $\hat{x}$ is calculated as $\hat{x}_l = a$ for the total soft value $q_l^{(a)}$ having the largest probability value as calculated in Equation 27.

Figure 5:
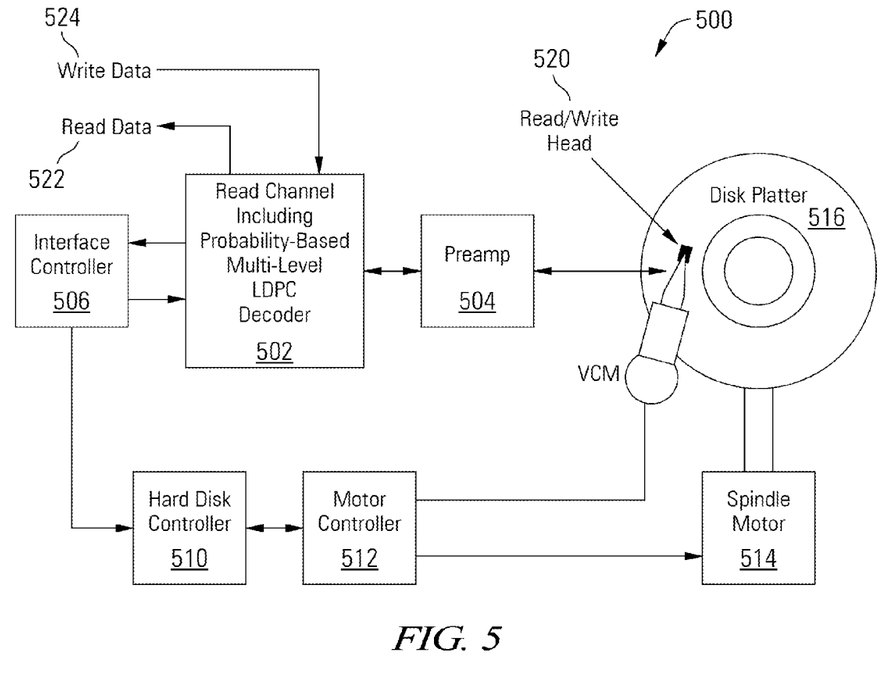
FIG. 5 depicts a storage system including a probability-based multi-level LDPC decoder in accordance with some embodiments of the present invention.

Turning to FIG. 5, a storage system 500 including a read channel circuit 502 with a probability-based multi-level LDPC decoder is depicted in accordance with some embodiments of the present invention. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head assembly 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly 520 to the proper data track on disk platter 516 under the direction of hard disk controller 510. Spindle motor 514 spins disk platter 516 at a determined spin rate (RPMs). Once read/write head assembly 520 is positioned adjacent the proper data track, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 decodes and digitizes the received analog signal to recreate the information originally written to disk platter 516. This data is provided as read data 522 to a receiving circuit. As part of decoding the received information, read channel circuit 502 processes the received signal using a probability-based multi-level LDPC decoder. Such a probability-based multi-level LDPC decoder may be implemented consistent with that disclosed above in relation to FIG. 3. In some cases, the probability-based LDPC decoder may be done consistent with the flow diagram disclosed above in relation to FIG. 4. A write operation is substantially the opposite of the preceding read operation with write data 524 being provided to read channel circuit 502. This data is then encoded and written to disk platter 516. It should be noted that various functions or blocks of storage system 500 may be implemented in either software or firmware, while other functions or blocks are implemented in hardware.

It should also be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 6:
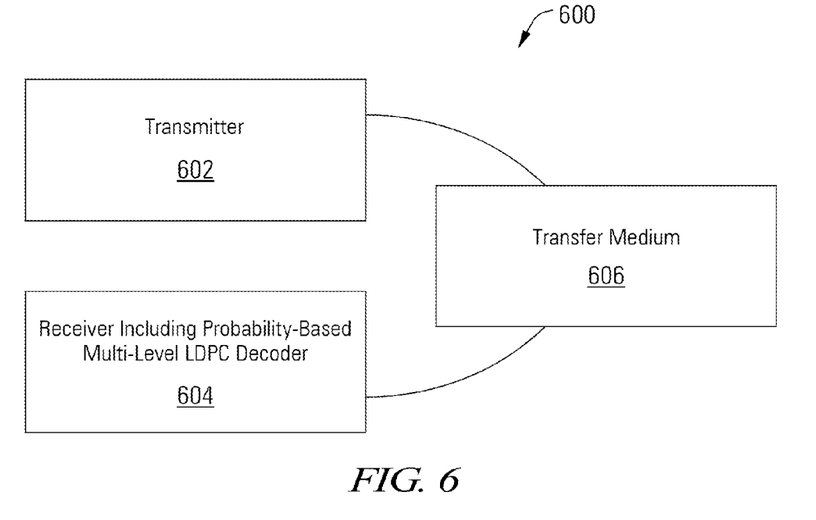
FIG. 6 depicts an example data transmission device including a probability-based multi-level LDPC decoder in accordance with some embodiments of the present invention.

Turning to FIG. 6, a wireless communication system 600 or data transmission device including a receiver 604 with a probability-based multi-level LDPC decoder is shown in accordance with some embodiments of the present invention. Communication system 600 includes a transmitter 602 that is operable to transmit encoded information via a transfer medium 606 as is known in the art. The encoded data is received from transfer medium 606 by receiver 604. Receiver 604 incorporates a probability-based multi-level LDPC decoder. Such a probability-based multi-level LDPC decoder may be implemented consistent with that disclosed above in relation to FIG. 3. In some cases, the decoding, may be done consistent with the flow diagram disclosed above in FIG. 4.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel methods and apparatuses for probability-based multi-level LDPC decoding. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for probability-based multi-level low density parity check decoding comprising:
   a horizontal updater in a low density parity check decoder operable to iteratively perform row processing to update probabilities of multi-level symbol values, wherein the horizontal updater is operable to calculate probabilities of values for a first sum of products of transmitted values and their corresponding non-zero elements from an H matrix for previous columns, and to calculate probabilities of values for a second sum of products of transmitted values and their corresponding non-zero elements from the H matrix for following columns, and to calculate a checksum based on the probabilities of values for the first sum and the second sum;
   a vertical updater in the low density parity check decoder operable to iteratively perform column processing to update the probabilities of the multi-level symbol values; and
   a check sum calculation circuit operable to calculate total soft values for the multi-level symbol values.

2. The apparatus of claim 1, wherein the horizontal updater is operable to approximate a probability that a checksum on a given row of an H matrix is satisfied if an element of a transmitted value has a particular value selected from a Galois field.

3. The apparatus of claim 1, wherein the vertical updater is operable to calculate a probability that an element of a transmitted value on a given column of an H matrix has a particular value selected from a Galois field based on extrinsic information from all of a plurality of check nodes other than those in a same row of the H matrix as the transmitted value.

4. The apparatus of claim 1, wherein the horizontal updater is further operable to iteratively calculate probabilities for symbols in previous columns and to iteratively calculate probabilities for symbols in following columns.

5. The apparatus of claim 1, wherein the horizontal updater comprises a multiplier and an adder.

6. The apparatus of claim 1, wherein the vertical updater comprises a multiplier.

7. The apparatus of claim 1, wherein the check sum calculation circuit comprises a multiplier.

8. The apparatus of claim 1, wherein the check sum calculation circuit is further operable to determine whether a stopping criterion has been met.

9. The apparatus of claim 1, wherein the check sum calculation circuit is further operable to calculate a hard decision for each of a plurality of symbols as an element in a Galois field having a highest probability for each of the plurality of symbols.

10. The apparatus of claim 1, wherein the apparatus is implemented as an integrated circuit.

11. The apparatus of claim 1, wherein the apparatus is incorporated in a storage device.

12. The apparatus of claim 1, wherein the apparatus is incorporated in a storage system comprising a redundant array of independent disks.

13. The apparatus of claim 1, wherein the apparatus is incorporated in a data transmission device.

14. A method of decoding data in a probability-based multi-level low density parity check decoder, comprising:
performing a horizontal update in a low density parity check decoder to iteratively perform row processing to update probabilities of multi-level symbol values, wherein the horizontal update comprises calculating probabilities of values for a first sum of products of transmitted values and their corresponding non-zero elements from an H matrix for previous columns, and calculating probabilities of values for a second sum of products of transmitted values and their corresponding non-zero elements from the H matrix for following columns, and calculating a checksum based on the probabilities of values for the first sum and the second sum;
performing a vertical update in the low density parity check decoder to iteratively perform column processing to update the probabilities of the multi-level symbol values; and
calculating a check sum across total soft values for the multi-level symbol values.

15. The method of claim 14, wherein the horizontal update comprises iteratively processing columns previous to a current column and iteratively processing columns following the current column.

16. The method of claim 14, wherein performing the vertical update comprises calculating a product of probabilities for a given column over all of a plurality of rows except a current row to yield probabilities of soft values for the current row.

17. The method of claim 16, wherein performing the vertical update further comprises multiplying the probabilities of the soft values for the current row by a normalization factor such that a sum of the probabilities of the soft values equals 1.

18. The method of claim 14, wherein performing the horizontal update comprises calculating a probability that a transmitted codeword symbol at a given row and a given column of an H matrix has a particular value selected from a Galois field, based on a second probability that an element in the given row and in a column previous to the given column has a second particular value and on a third probability that a second element in the given row and in a column subsequent to the given column has a third particular value.

19. The method of claim 14, wherein calculating the check sum for a row of an H matrix comprises adding a first probability from a previous column in the row, a second probability from a subsequent column in the row, and an element of a Galois field multiplied by a value of the H matrix in the row.

20. A storage system comprising:
a storage medium maintaining a data set;
a write head operable to magnetically record the data set to the storage medium; and
a probability-based multi-level low density parity check decoder operable to iteratively perform horizontal updates and vertical updates to yield a hard decision comprising an element of a Galois field having a highest probability value for each of a plurality of symbols, wherein performing the horizontal updates comprises calculating probabilities of values for a first sum of products of transmitted values and their corresponding non-zero elements from an H matrix for previous columns, and calculating probabilities of values for a second sum of products of transmitted values and their corresponding non-zero elements from the H matrix for following columns, and calculating a checksum based on the probabilities of values for the first sum and the second sum.

* * * * *